(12) United States Patent
Tanaka

(10) Patent No.: US 6,807,100 B2
(45) Date of Patent: Oct. 19, 2004

(54) NONVOLATILE SEMICONDUCTOR MEMORY DEVICE AND DATA WRITE METHOD THEREOF

(75) Inventor: Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/446,130

(22) Filed: May 27, 2003

(65) Prior Publication Data

US 2003/0234408 A1 Dec. 25, 2003

(30) Foreign Application Priority Data

May 29, 2002 (JP) ........................................ 2002-156191

(51) Int. Cl.[7] .............................................. G11C 16/04
(52) U.S. Cl. ............................ 365/185.19; 365/185.28; 365/185.24
(58) Field of Search ....................... 365/185.19, 185.28, 365/185.24, 185.33, 185.03

(56) References Cited

U.S. PATENT DOCUMENTS

| | | |
|---|---|---|
| 5,555,204 A | 9/1996 | Endoh et al. |
| 5,682,346 A | 10/1997 | Yamamura et al. |
| 5,870,334 A | 2/1999 | Hemink et al. |
| 6,459,621 B1 * | 10/2002 | Kawahara et al. ..... 365/185.24 |

OTHER PUBLICATIONS

U.S. patent application No. 10/051,372 filed Jan. 22, 2002.
G. J. Hemink et al., "Fast and Accurate Programming Method for Multi–Level NAND EEPROMs", 1995 Symposium on VSLI Technology Digest of Technical Papers, pp. 192–130.
T. Tanaka et al., "A 3.4 Mbyte/sec Programming 3–Level NAND Flash Memory Saving 40% Die Size Per Bit", 1997 Symposium on VSLI Technology Digest of Technical Papers, pp. 65–66.

* cited by examiner

Primary Examiner—David Lam
(74) Attorney, Agent, or Firm—Hogan & Hartson, LLP

(57) ABSTRACT

A semiconductor integrated circuit device includes first and second nonvolatile semiconductor memory cells and a write control circuit. The write control circuit supplies a first pre-programming pulse, a second pre-programming pulse and staircase programming pulses simultaneously to the first and second memory cells independently of the write statuses thereof. The second pre-programming pulse is higher than the first pre-programming pulse by a first potential difference. The staircase programming pulses have an initial voltage lower than the second pre-programming pulse and increase the voltage at a rate of a second potential difference per pulse. The second potential difference is smaller than the first potential difference.

20 Claims, 12 Drawing Sheets

Memory card 100
or IC card 200
or card holder 130

NONVOLATILE SEMICONDUCTOR MEMORY DEVICE AND DATA WRITE METHOD THEREOF

CROSS-REFERENCE TO RELATED APPLICATIONS

This application is based upon and claims the benefit of priority from prior Japanese Patent Application No. 2002-156191 filed May 29, 2002, the entire contents of which are incorporated herein by reference.

BACKGROUND OF THE INVENTION

1. Field of the Invention

The present invention relates to a nonvolatile semiconductor memory device such as a flash memory and a data-write method thereof.

2. Description of the Related Art

In a flash memory, data is stored by changing the threshold voltage of the floating gate of a memory-cell transistor by changing the amount of charge stored therein through erase and write operations. For example, data "1" is stored by releasing electrons from the floating gate, thereby allowing the threshold to be negative and data "0" is stored by injecting electrons.

In a NAND flash memory, data 1 or 0 is distinguished by supplying, for example, 0 V, to a word line of the memory cell selected in a readout operation. A plurality of unselected memory cells is connected in series to the selected memory cell. Therefore, for example, 4.5 V, is supplied to the word lines of the unselected memory cells to bring the unselected memory cells into an electrically conductive state independently of the data stored therein. Therefore, the threshold of the memory cell to be written during a write operation must be sufficiently controlled so that it falls within the range of 0 to 4.5 V.

Therefore, to control the threshold voltage of a memory cell during the write operation, the commonly used data write method employs a "step-up write voltage". Such a data write method is described in Fast and Accurate Programming Method for Multi-level NAND EEPROMs, pp 129–130, Digest of 1995 Symposium on VLSI Technology.

The data write method using the "step-up write voltage" employs the following characteristic feature: when the write voltage to be supplied to a memory cell is increased at a predetermined rate (e.g., 0.2 per 10 μsec), the threshold voltage increases at the same rate (e.g., 0.2 per 10 μsec). Further in this method, the threshold voltage of each memory cell is detected at intervals of 10 μsec and when the threshold voltage reaches a predetermined write verify voltage, the write operation is inhibited. In this manner, the threshold voltage is controlled so that it falls within a margin 0.2V above the write-verify voltage.

In the method mentioned above, the write operation is controlled by using the feature that the threshold voltage increases at a constant rate. Therefore, before the verify operation is initiated, a so-called pre-write operation is performed by setting the initial write voltage to a sufficiently low value in order to increase the threshold voltage at the constant rate in advance.

BRIEF SUMMARY OF THE INVENTION

A semiconductor integrated circuit device according to a first aspect of the present invention comprises:

first and second electrically rewritable nonvolatile semiconductor memory cells; and a write control circuit, which supplies a plurality of programming pulses simultaneously to the first and second memory cells, the write control circuit supplies:

a first pre-programming pulse simultaneously to the first and second memory cells independently of the write statuses thereof;

a second pre-programming pulse, after the supply of the first pre-programming pulse, simultaneously to the first and second memory cells independently of the write statuses thereof, the second pre-programming pulse having a potential higher than the first pre-programming pulse by a first potential difference; and staircase programming pulses, after the supply of the second pre-programming pulse, simultaneously to the first and second memory cells, the staircase programming pulses having an initial voltage lower than the second pre-programming pulse and increasing the voltage at a rate of a second potential difference per pulse, the second potential difference being smaller than the first potential difference.

A method of controlling a write operation of a nonvolatile semiconductor memory device according to a second aspect of the present invention comprises:

supplying a first pre-programming pulse simultaneously to first and second memory cells that are connected to a common word line and discrete two bit lines independently of the write statuses of the first and second memory cells;

supplying a second programming pulse, after the supply of the first pre-programming pulse, simultaneously to the first and second memory cells independently of the write statuses thereof, the second programming pulse being higher than the first pre programming pulse by a first potential difference;

supplying a staircase programming pulses, after the supply of the second pre-programming pulse, simultaneously to the first and second memory cells, the staircase programming pulses having an initial voltage lower than the second pre-programming pulse and increasing the voltage nearly at a rate of a second potential difference per pulse, and the second potential difference being smaller than the first potential difference; and inhibiting a write operation to a memory cell that has been detected to reach a predetermined write status during supply of the staircase programming pulses.

DETAILED DESCRIPTION OF THE INVENTION

Figure 1:
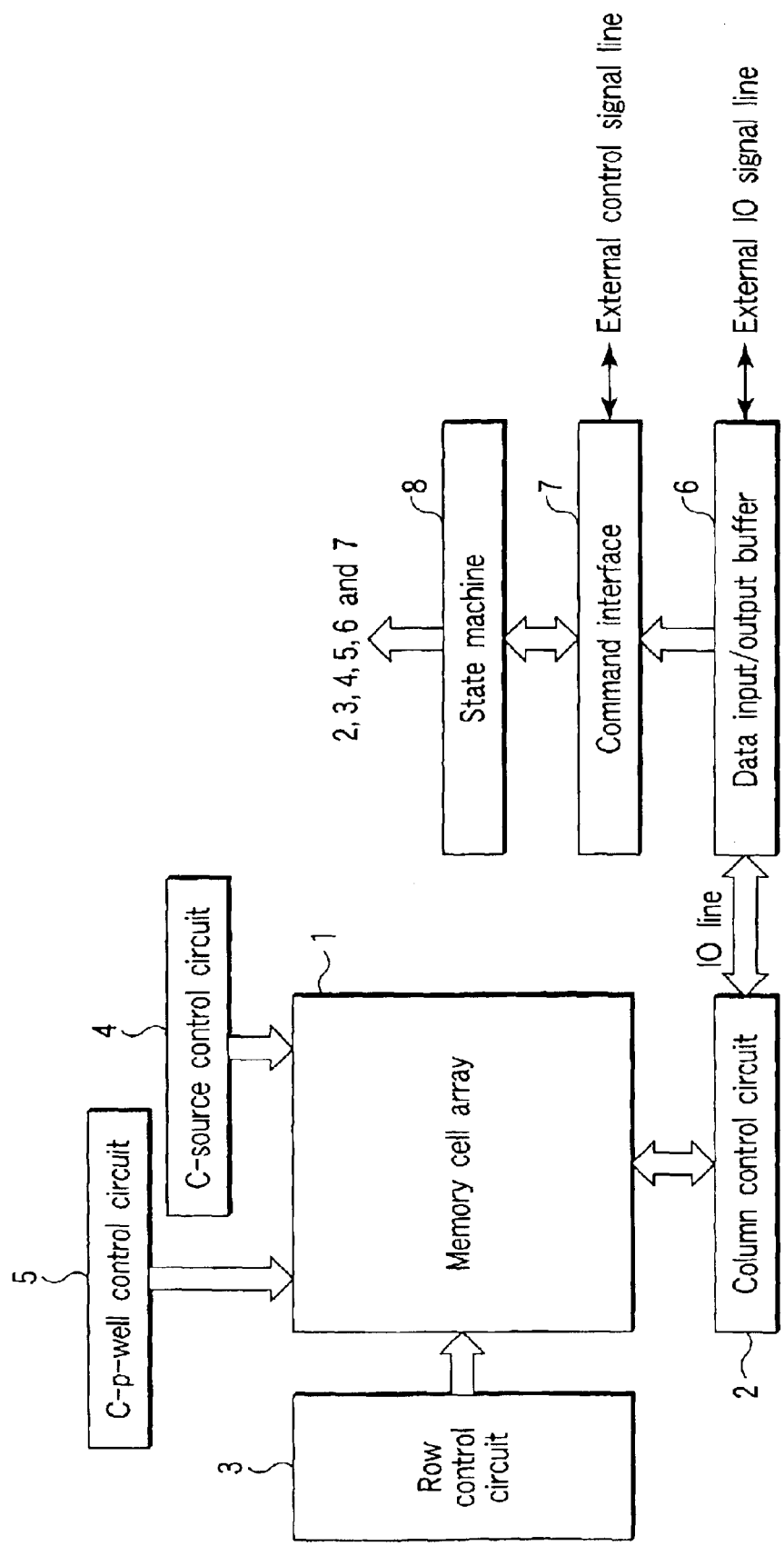
FIG. 1 is a block diagram showing an arrangement of a nonvolatile semiconductor memory device according to an embodiment of the present invention.

Now, an embodiment of the present invention will be described with reference to the accompanying drawings. Like reference numerals are used to designate like structural elements throughout the drawings.

FIG. 1 is a block diagram showing an arrangement of a nonvolatile semiconductor memory device according to an embodiment of the present invention. In this embodiment, a NAND-type flash memory is described as an example of a nonvolatile semiconductor memory device; however, the application of the present invention is not limited to the NAND-type flash memory.

In a memory array 1, nonvolatile semiconductor memory cells are arranged in a matrix form. As the nonvolatile semiconductor memory cells, flash memory cells may be used, for example.

A column control circuit 2 controls bit lines of the memory cell array 1 to erase data from memory cells, write data to the memory cells and readout data from the memory cells. The column control circuit 2 is arranged adjacent to the memory cell array 1.

A row control circuit 3 selects a word line of the memory cell array 1 and supplies a voltage required for erase, write, read, write-verify, or erase-verify operation to the word line selected above.

A C-source control circuit 4 controls the source lines of the memory cell array 1.

A P-type well control circuit 5 controls p-type wells in which the memory cell array 1 is to be formed.

The data input/output buffer 6 is electrically connected to the column control circuit 2 through an IO line and further electrically connected to an external host computer through an external IO signal line. In the data input/output buffer 6, for example, an input/output buffer circuit is arranged. The data input/output buffer 6 receives write data, outputs readout data, and receives address data and command data. The data input/output buffer 6 sends the write data received above to the column control circuit 2 through the IO line, and receives readout data from the column control circuit 2 through the IO line. The data input/output buffer 6, in order to select an address of the memory cell array 1, further sends address data externally input to the column control circuit 2 and the row control circuit 3 through a state device 8, and also sends command data externally input from the external host computer to a command interface 7.

The command interface 7 receives a control signal from the host computer through the external control signal line, and determines whether write data, command data, or address data is input into the data input/output buffer 6, and then, transfers only command data to the state device 8, as received command data.

The state device 8 manages the entire flash memory. More specifically, the state device 8 receives command from the host computer and manages readout, write, write-verify, erase, erase-verify, and data input-output operations.

Figure 2:
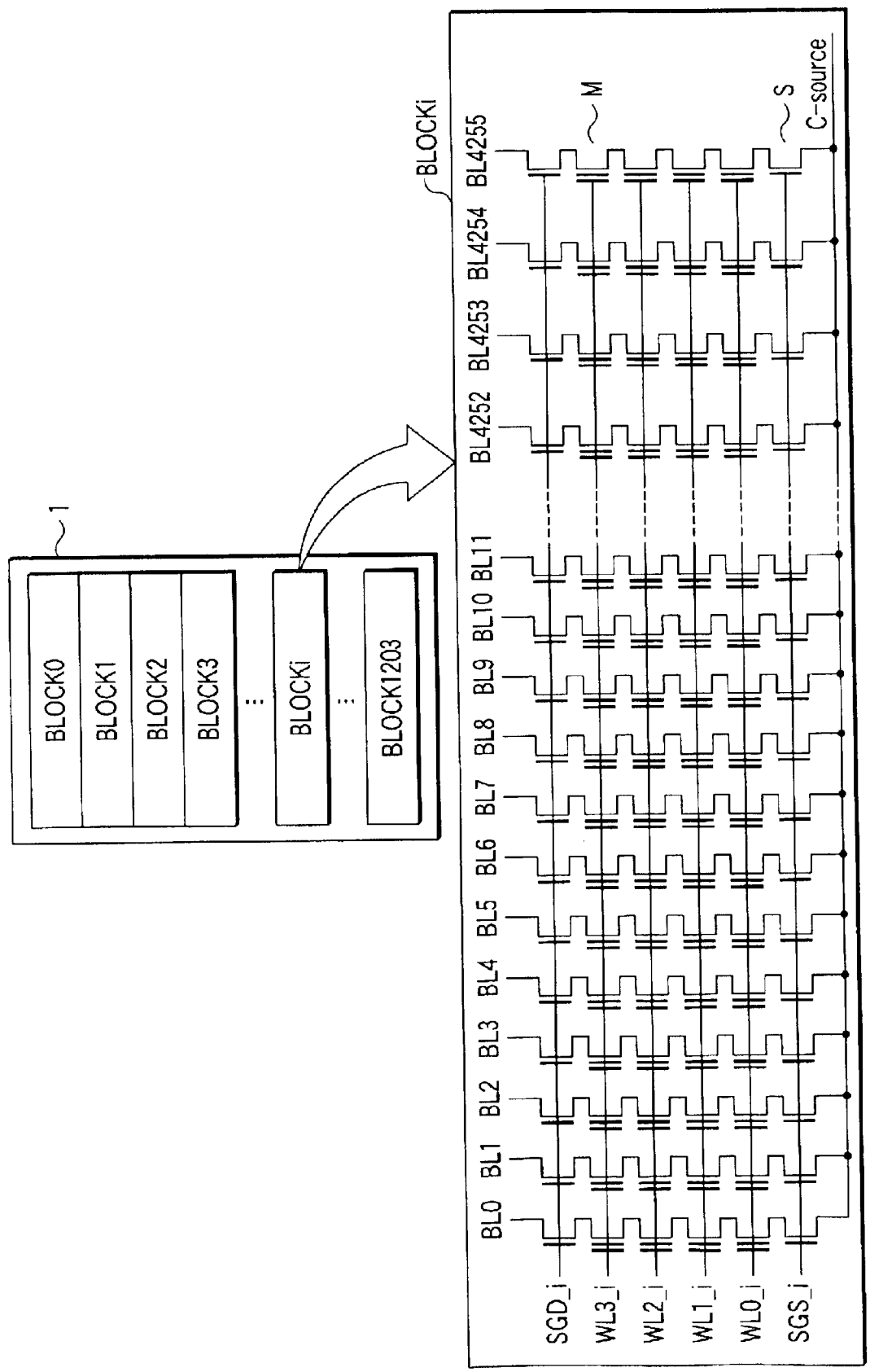
FIG. 2 is a circuit arrangement of the memory cell array shown in FIG. 1.

FIG. 2 is a circuit arrangement of the memory cell array 1 shown in FIG. 1.

As shown in FIG. 2, the memory cell array 1 is divided into a plurality of blocks, e.g., 1024 blocks (Block 0 to block 1023). A block (block i) is a minimum unit for performing an erase operation. Each block i is composed of 4256 NAND-type memory units.

In this example, each NAND-type memory unit is composed of 4 nonvolatile semiconductor memory cells M connected in series. One end of the series of nonvolatile semiconductor memory cells M is connected to a bit line BL through a selective gate S connected to a selective gate line SGD. The other end is connected to a common source line (C-source) through a selective gate S connected to a selective gate line SGS. Each of the memory cells is connected to a word line W. Data-write and readout operations are performed simultaneously to 4256 memory cells connecting to a single word line WL. 4256 memory cells, each storing 1-bit data, are put together to compose a minimum date-write and readout unit called a "page".

Figure 3:
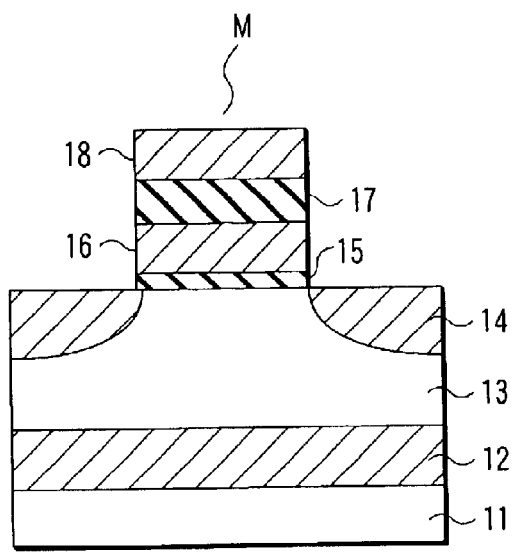
FIG. 3 is a sectional view of the nonvolatile memory cell shown in FIG. 2.

FIG. 3 is a sectional view of the nonvolatile memory cell M shown in FIG. 2.

As show in FIG. 3, an N-type well 12 is formed in a p-type semiconductor substrate 11 and a p-type well 13 is formed in the N-type well 12. In the P-type well 13, an N-type diffusion layer 14 is formed. The N-type diffusion layer 14 serves as the source and drain of the nonvolatile memory cell M. A tunnel insulating film 15 is formed on the channel region. On the tunnel insulating film 15, a floating gate 16 is staked. The tunnel insulating film 15 is formed of a silicon oxide film, for example. On the floating gate 16, an interlayer gate insulating film 17 and a control gate 18 are successively formed in this order. The interlayer gate insulating film 17 is formed of a so-called ONO film consisting of silicon dioxide, silicon nitride, and silicon dioxide, for example. The control gate 18 serves as a word line WL.

Figure 4:
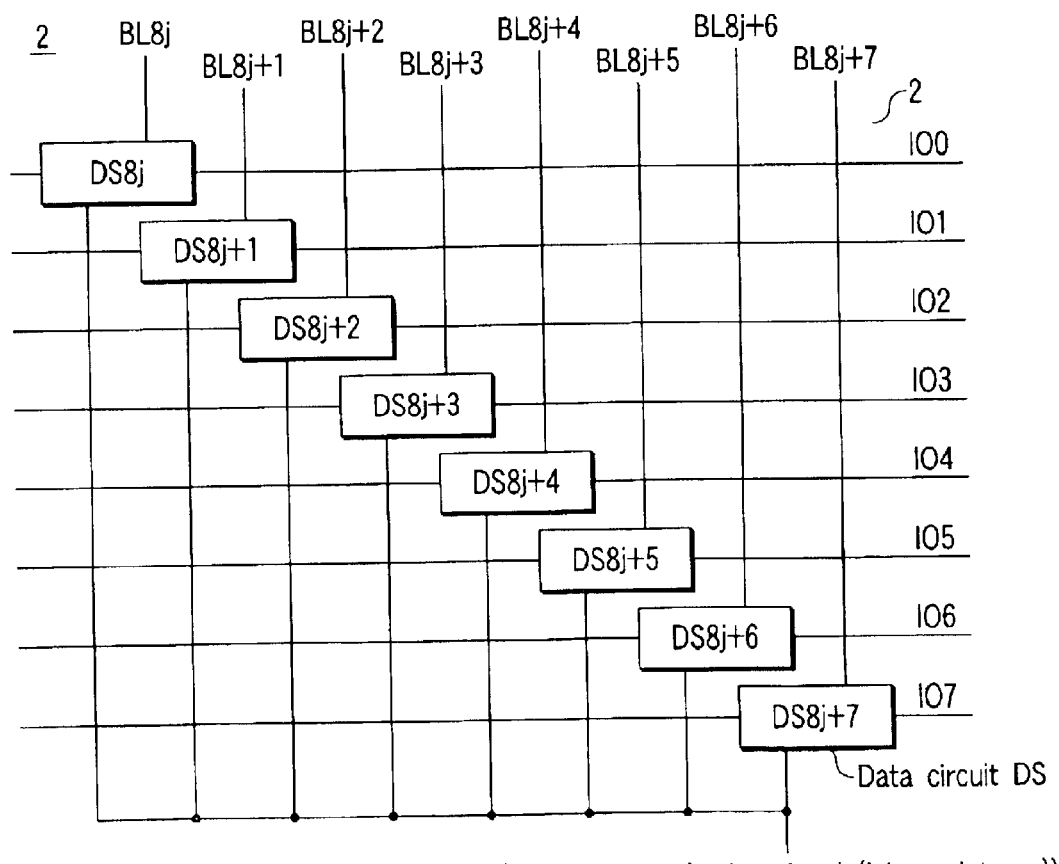
FIG. 4 is a block diagram showing an arrangement of the column control circuit shown in FIG. 1.

FIG. 4 is a block diagram showing an arrangement of the column control circuit shown in FIG. 1.

As shown in FIG. 4, a data storage circuit DS is provided for every bit line BL. The data storage circuit DS is connected to the data input/output buffer 6 through a data input/output line (IO line: IO0 to IO7) and stores write data and read data.

Each data storage circuit DS controls a bit line BL in accordance with the stored data during a write operation to control data write and senses the voltage of a bit line BL during a readout operation to store readout data. All data storage circuits DS work at the same time, since they are controlled by a common control signal except for the data input/output time.

Figure 5:
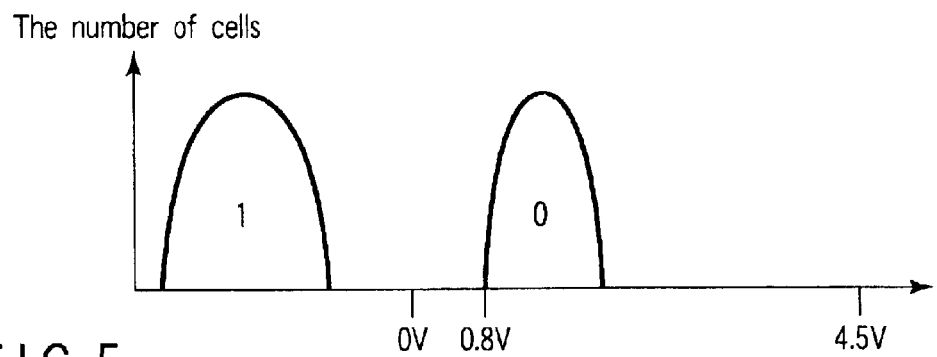
FIG. 5 is a graph showing the relationship between the data and threshold voltage in a nonvolatile semiconductor memory device according to an embodiment of the present invention.

FIG. 5 is a graph showing the relationship between the data and threshold voltage of the nonvolatile semiconductor memory device according to an embodiment of the present invention. In this case the nonvolatile semiconductor memory device is a NAND-type flash memory.

Erase is executed by supplying a high voltage, for example, 20 V, to the P-type well 13 shown in FIG. 3 while keeping the control gate 18 at 0 V. At this time, electrons are released from the floating gate 16 to the P-type well 13 through the tunnel oxide film 15. As a result, the threshold voltage of the memory cell M becomes a readout voltage or less, that is, 0 V or less. This state is a memory status "1".

Write is executed by supplying a staircase programming pulses Vpgm to the control gate 18 while keeping the P-type well 13 and the N-type diffusion layer 14 at 0 V. the staircase programming pulses Vpgm will be more specifically described later. Since electrons are injected into the floating gate 16 from the channel region by supplying the staircase programming pulses Vpgm, the threshold voltage of the memory cell M goes to positive ("0" write). When the threshold voltage exceeds a write verify voltage, for example, 0.8 V, the write operation is inhibited independently in every memory cells. The threshold of the write verify voltage is controlled so as to fall within the range of 4.5 V, for example.

Table 1 and Table 2 show voltages of memory cell arrays at the time of write, readout, erase verify, and write verify operations by way of example. In Tables 1 and 2, a word line WL2 is selected from the word lines WL0 to WL3 during the write and readout operations.

TABLE 1

|  | Erase | "0"-write | "1"-write |
| --- | --- | --- | --- |
| BL | Floating | 0 V | 3 V |
| SGD | Floating | 3 V | 3 V |
| WL3 | 0 V | 10 V | 10 V |
| WL2 | 0 V | Vpgm | Vpgm |
| WL1 | 0 V | 10 V | 10 V |
| WL0 | 0 V | 10 V | 10 V |
| SGS | Floating | 0 V | 0 V |
| C-source | Floating | 0 V | 0 V |
| C-p-well | 20 V | 0 V | 0 V |

TABLE 2

|  | Readout | Erase verify | Write verify |
| --- | --- | --- | --- |
| BL | H or L | H or L | H or L |
| SGD | 4.5 V | 4.5 V | 4.5 V |
| WL3 | 4.5 V | 0 V | 4.5 V |
| WL2 | 0 V | 0 V | 0.8 V |
| WL1 | 4.5 V | 0 V | 4.5 V |
| WL0 | 4.5 V | 0 V | 4.5 V |
| SGS | 4.5 V | 4.5 V | 4.5 V |
| C-source | 0 V | 0 V | 0 V |
| C-p-well | 0 V | 0 V | 0 V |

[Erase Operation]

As shown in Table 1, erase is performed by supplying 20 V to the P-type well 13 (C-p-well) while all word lines WL0 to WL3 of a selected block are maintained at 0 V. As a result, the electrons are released from the floating gate 16 of a memory cell M and the threshold voltage goes negative. In this way, the memory cell M is set at the status "1". The word line and the bit line etc., of unselected blocks go to a floating state and capacitatively coupled with the P-type well 13. As a result, their voltages become nearly 20 V.

[Write Operation]

As shown in Table 1, a write operation is performed by supplying staircase programming pulses Vpgm to the selected word line WL2. When the selected bit line BL is maintained at 0 V, electrons are injected into the floating gate 16, increasing the threshold voltage ("0" write status). To inhibit the increase of the threshold voltage, the source voltage Vdd (up to 3 V) is supplied to the bit line BL ("1" write status).

[Readout]

As shown in Table 2, readout is performed by supplying a readout voltage of 0 V to the selected word line WL2. When the threshold voltage of the memory cell M is lower than the readout voltage, a bit line BL is made electrically conductive to a common source line, C-source. As a result, the potential of the bit line BL becomes relatively low "L". On the contrary, when the threshold voltage of the memory cell M is higher than the readout voltage, the bit line BL is not electrically conductive to the common source line, C-source. As a result, the potential of the bit line BL becomes relatively level, "H".

[Erase Verify]

As shown in Table 2, erase verify is performed by setting all word lines, WL0 to WL3, of the selected block at 0 V. When the threshold voltages of all 4 memory cells are lower than 0 V in the NAND type memory unit, the bit line BL and the common source line C-source becomes electrically conductive, with the result that the potential of the bit line BL becomes relatively low "L". On the contrary, when any one of the threshold voltages of 4 memory cells is 0 V or more, the bit line BL and the common source line C-source do not become electrically conductive, with the result that the potential of the bit line BL becomes relatively high "H".

[Write Verify]

Write verify is performed by supplying a verify potential of 0.8 V to the selected word line WL2. When the threshold voltage of the memory cell M is lower than the verify potential, a bit line BL and a common source line C-source become electrically conductive, with the result that the potential of the bit line BL becomes relatively high ("H"). On the contrary, when the threshold voltage of the memory cell M is the verify voltage or more, the bit line BL and the common source line C-source do not become electrically conductive, with the result that the potential of the bit line BL becomes relatively high "H".

Figure 6:
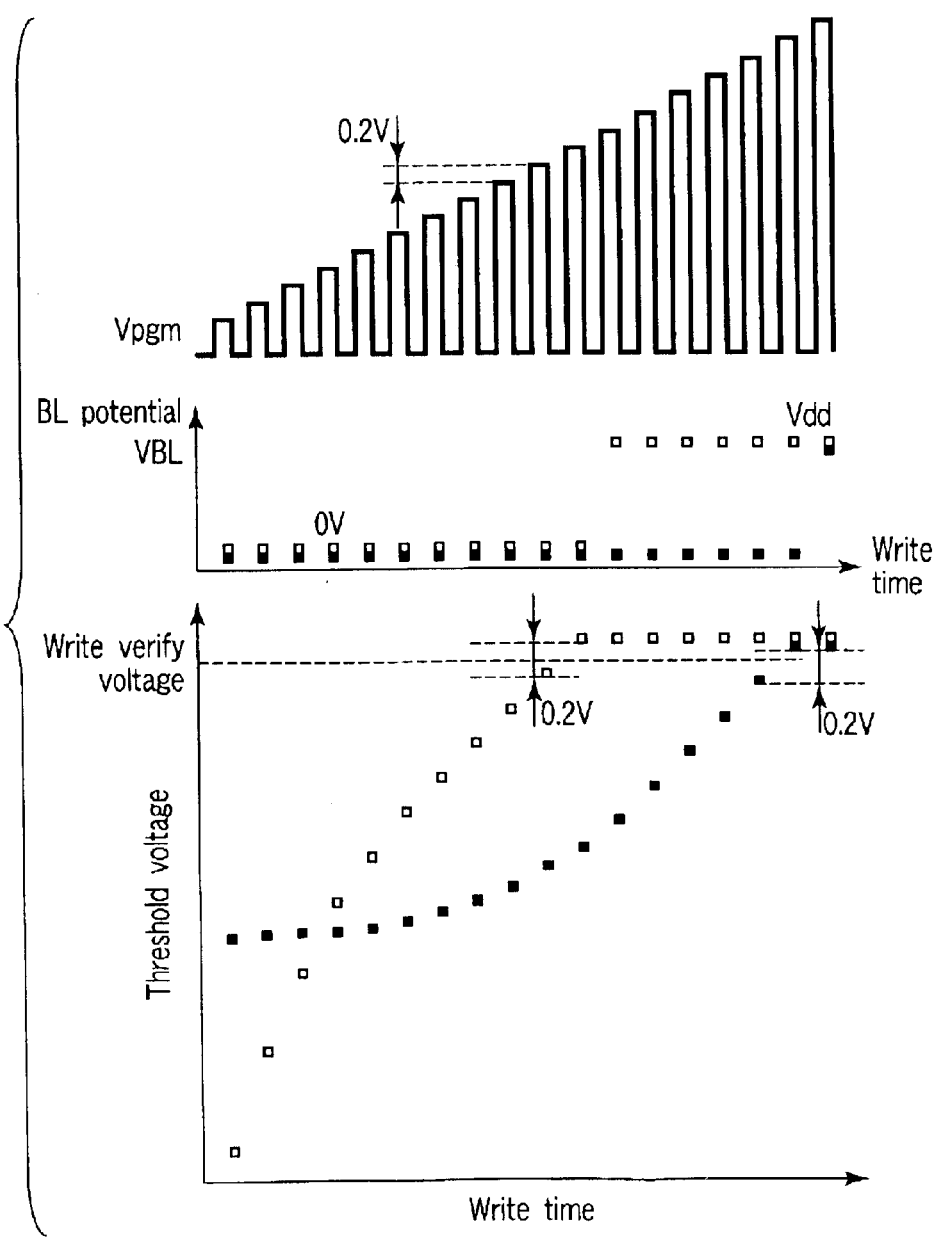
FIG. 6 illustrates a data write method performed in a typical nonvolatile semiconductor memory device and control of the threshold voltage thereof.

FIG. 6 illustrates a data write method performed in a typical nonvolatile semiconductor memory device and control of the threshold voltage thereof.

In FIG. 6, an open square □ indicates the threshold voltage of an easy-to-write memory cell and a solid square ■ indicates the threshold voltage of a hard-to-write memory cell. These two memory cells are connected a common word line WL and initially erased and thus have negative threshold voltages.

The write voltage Vpgm comprises a plurality of pulses. The voltage increases by 0.2 V per pulse. When the voltage of a bit line BL serving as a write control voltage is set at 0 V, the threshold voltage increases at the same rate of 0.2 V per pulse after several pulses. Every after a programming pulse voltage is supplied, write verify is performed. When the potential of the bit line of the memory cell whose threshold voltage is detected to reach the write verify voltage, is represented by Vdd. In this way, write to memory cells is inhibited one by one. Therefore, the threshold voltage has a distribution width of 0.2 V. In this case, the first to tenth programming pulses are required for increasing the threshold voltage of the easy-to-write memory cell at a rate of 0.2 V per pulse. These ten programming pulses are called "pre-programming pulses". Since the voltage of the pre-programming pulses is adjusted such that the threshold voltage of a memory cell does not reach the write verify level during the pre-write operation, write verify cannot be performed every after a pre programming pulse is supplied. Such adjustment is performed by burning a fuse prepared for determining the voltage of the pre-programming pulse based on the measurement with respect to the easiness of write performed in a test run.

Figure 7:
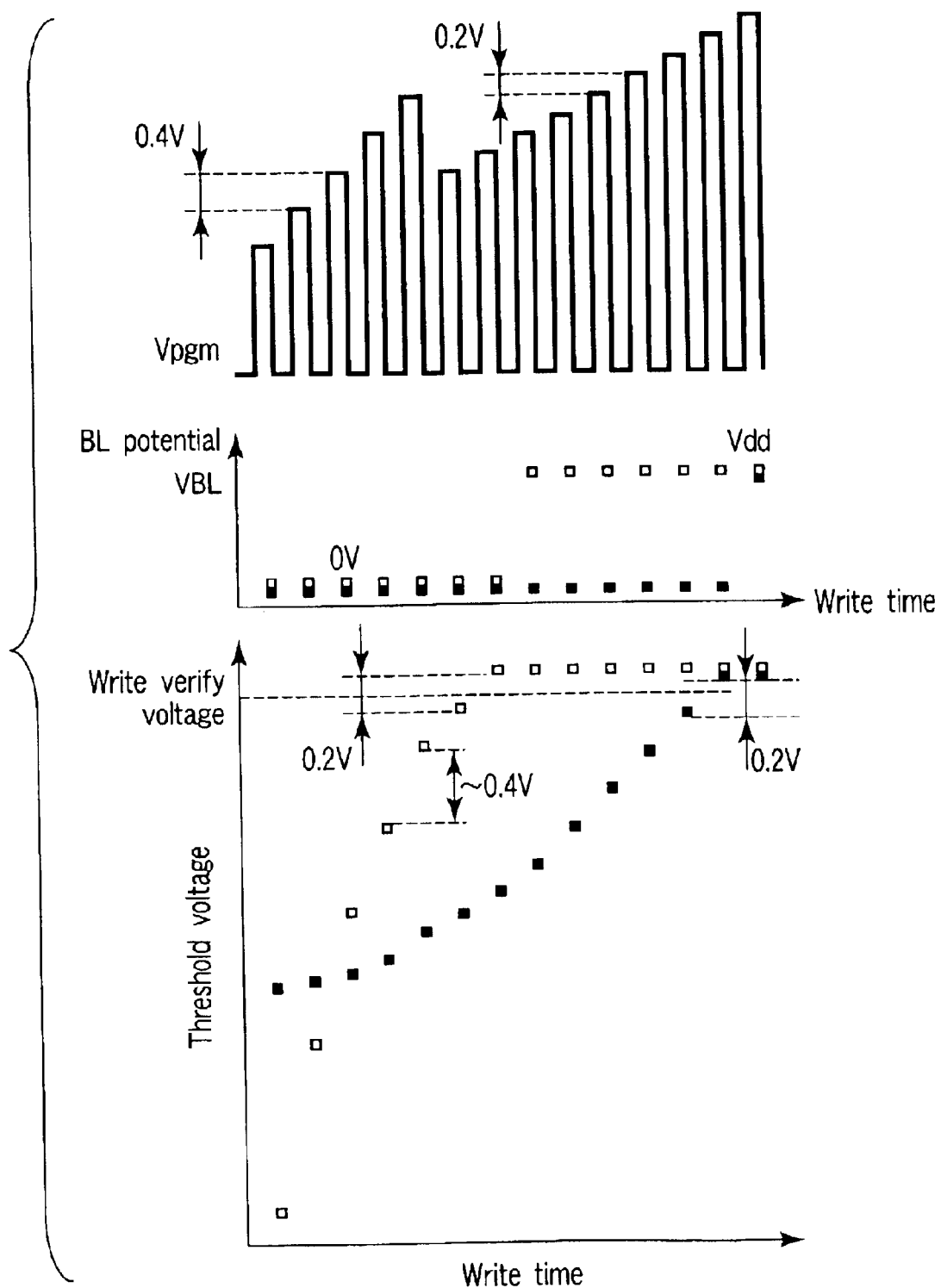
FIG. 7 illustrates a data write method performed in a nonvolatile semiconductor memory device according to an embodiment of the present invention and control of the threshold voltage thereof.

FIG. 7 illustrates a data write method performed in a nonvolatile semiconductor memory device according to an embodiment of the present invention and control of the threshold voltage thereof.

In FIG. 7, an open square □ indicates the threshold voltage of an easy-to-write memory cell and a solid square ■ indicates the threshold voltage of a hard-to-write memory cell. These two memory cells are connected to a common word line WL and initially erased and thus have negative threshold voltages.

A pre-write voltage Vpgm comprises a plurality of pulses (1st to 5th pulses) and increases, for example, at a rate of 0.4 V per pulse. When the voltage of a bit line BL, serving as a write suppress voltage, is set at 0 V, the threshold voltage increases at the same rate of 0.4 V per pulse after several pulses. Since the voltage of the pre-programming pulse is adjusted such that the threshold voltage of a memory cell does not reach a write verify level during the pre-write operation, write verify cannot be performed every after a pre-programming pulse is supplied.

The write voltage Vpgm comprises a plurality of pulses (6th pulse onward) and increases at a rate of 0.2 V per pulse. The initial value is lower than the last voltage of the pre-programming pulse, for example, by 0.8 V. As a result, the increase rate of the threshold voltage is reduced from 0.4 V per pulse to 0.2 V per pulse. Every after a programming pulse is supplied, write verify is performed. The bit line voltage of the memory cell whose threshold voltage is detected to reach the write verify voltage is represented by Vdd. In this way, write to memory cells is inhibited one by one. Therefore, the threshold voltage has a distribution width of 0.2 V.

When FIG. 6 is compared to FIG. 7, it is found that the number of pre-programming pulses reduced to the half.

Figure 8:
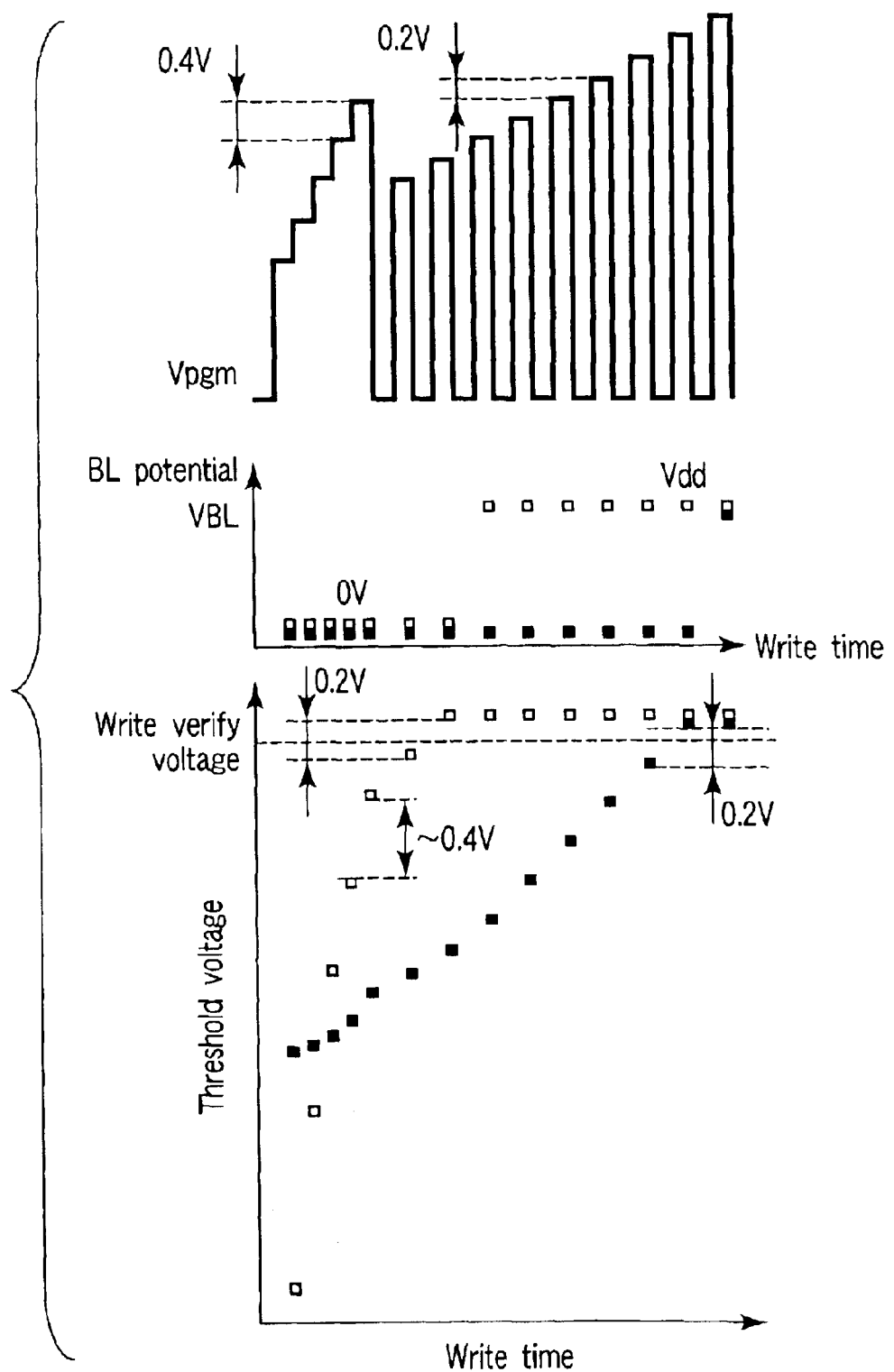
FIG. 8 illustrates a modified example of the data write method performed in a nonvolatile semiconductor memory device according to an embodiment of the present invention and control of the threshold voltage thereof.

FIG. 8 illustrates a modified data-write method performed in a nonvolatile semiconductor memory device according to an embodiment of the present invention and control of the threshold voltage thereof.

As shown in FIG. 8, write verify is not performed every after the pre-programming pulse is supplied. Therefore, no interval (0 sec.) is set between pre-programming pulses. The same practical effects as above can be obtained in this case. This is also regarded as the pre-staircase programming pulses.

Figure 9:
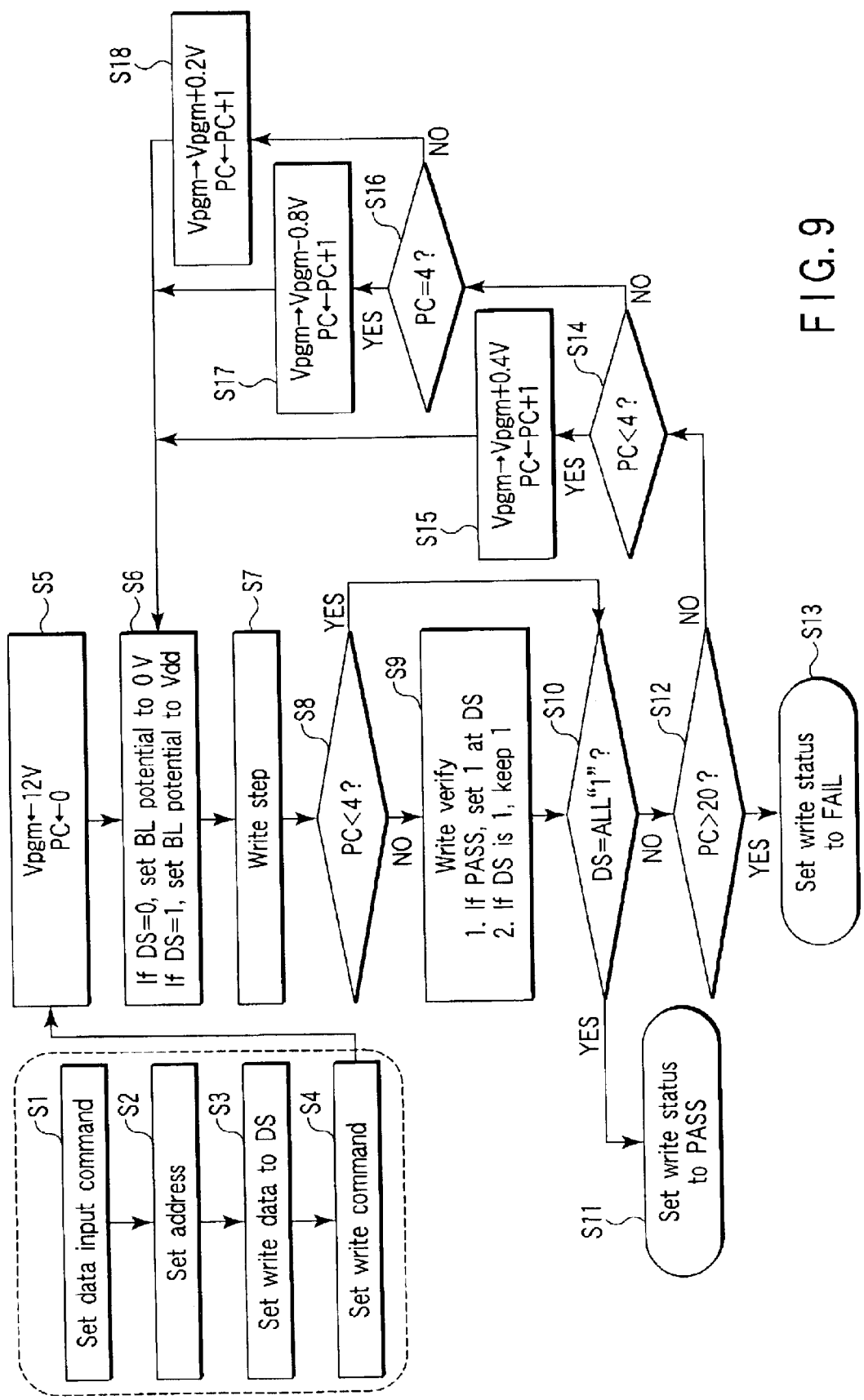
FIG. 9 is a flow chart showing a data-write algorithm of a data write method performed in a nonvolatile semiconductor memory device according to an embodiment of the present invention.

FIG. 9 is a flow chart showing a data-write algorithm of a data write method performed in a nonvolatile semiconductor memory device according to an embodiment of the present invention.

First, a data input command is received from an external host computer and set in a state device 8 (S1).

Second, address data is received from the external host computer and set in the state device 8 for selecting a write page (S2).

Third, write data corresponding to one page is received and set so as to correspond to a data storage circuit DS (S3).

Fourth, the write command given by the external host computer is received and set in the state device (S4).

After the write command is set up, steps of S5 to S18 are automatically started up (performed) by the state device 8.

First, the initial value of write voltage Vgpm is set at 12 V and write counter PC is set at 0 (S5).

Second, when the data of the data storage circuit DS is 0, meaning that the write status is "0", the voltage of a bit line BL (serving as a write control voltage) is set at 0 V. When the data of the data storage circuit DS is 1, meaning that the write status is "1", the voltage of a bit line BL (serving as a write control voltage) is set at Vdd (S6).

Next, a programming pulse is given to one-page data memory cells by using the write voltage Vpgm and write control voltage thus set up. In this way, a write step is performed (S7).

Subsequently, it is determined whether the write counter PC is smaller than 4 or not (S8). If the write counter PC is 4 or more, the flow goes to a write verify step for detecting a write status (S9). In the write verify step, the data of the data storage circuit DS corresponding to the memory cell whose state is determined to reach a predetermined write status is changed from "0" to "1". The data storage circuit DS storing "1", the value "1" is maintained. When the value of the write counter PC is smaller than 4, the flow skips the write verify step and goes to step S10. In step S10, it is determined as to whether data of all data storage circuit DS are 1 or not (S10). If the data of all data storage circuit DS are 1, the flow goes to step S11 where the write status is set at "PASS" (S11). In this manner, the entire write process is completed. If the data of any one of data storage circuits DW is 0, it is determined whether the value of the write counter PC is larger than 20 or not (S12). If the value of the write counter PC is larger than 20, the write status is set at "FAIL". In this way, the data write is terminated (S13). When the value of the write counter PC is 20 or less, the write counter PC is inspected.

First, it is determined whether the value of the write counter PC is 4 or smaller (S14). If the value of the write counter PC is 4 or more, whether the value of the write counter PC is equal to 4 or not is determined (S16).

1) When the value of the write counter PC is smaller than 4, the programming pulse voltage is increased by 0.4 V to thereby increase the value of the write counter PC by 1 (S15).

2) When the value of the write counter PC is equal to 4, the programming pulse voltage is reduced by 0.8 V to thereby increase the value of the write counter PC by 1 (S17).

3) When the value of the write counter PC is larger than 4, the programming pulse voltage is increased by 0.2 V to thereby increase the value of the write counter PC by 1 (S18).

Thereafter, the flow goes back to step S6 and steps S14 to S18 are repeated to achieve the staircase programming pulses shown in FIG. 7.

Figure 10:
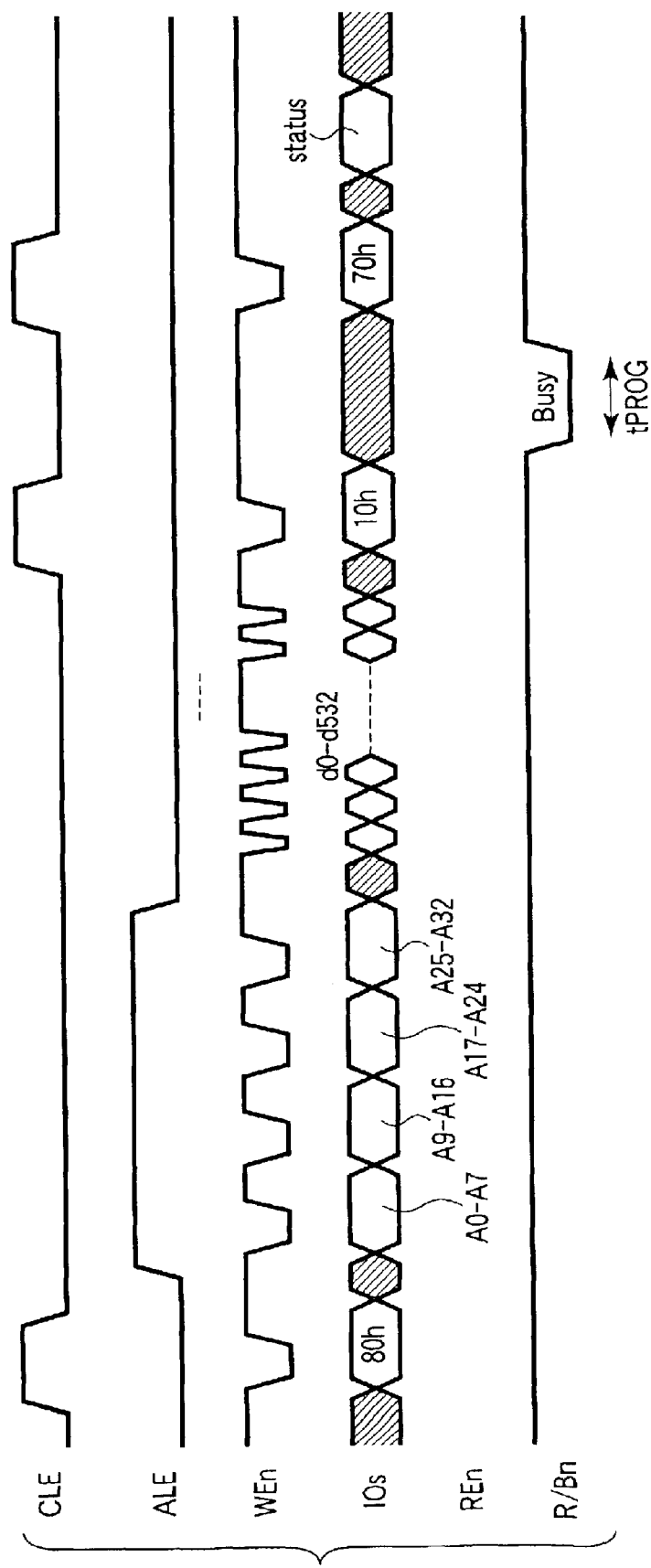
FIG. 10 is a timing chart showing a data write control method performed in a nonvolatile semiconductor memory device according to an embodiment of the present invention, as viewed from a host computer.

FIG. 10 is a timing chart showing a data write control method performed in a nonvolatile semiconductor memory device according to an embodiment of the present invention, as viewed from a host computer. In FIG. 10, the data write control method is illustrated by using an external IO signal and an external control signal.

As shown in FIG. 10, a host computer, for example, an external host computer, inputs a data command 80h from a data input-output line IOs by setting a command latch enable signal (CLE) at "H". Data is input by setting a write enable command WEn as "L". Subsequently, addresses A0 to A32 are input from the data input/output line IOs by setting an address latch enable signal ALE at "H". Furthermore, one-page size write data is input in series. When the write command 10h is input, a busy signal R/Bn is output from a NAND flash memory, in which steps S5 to S18 (shown in FIG. 9) are automatically performed.

After the busy signal R/Bn returns to "H" (ready state), a status read command 70h is given to readout whether the write status (that is, write operation) is "PASS" or "FAIL".

The nonvolatile semiconductor memory device according to the aforementioned embodiment comprises first and second electrically rewritable nonvolatile semiconductor memory cells, and a write control circuit, which controls a write operation by supplying a plurality of programming pulses simultaneously to the first and second memory cells. As the nonvolatile semiconductor memory cell, a transistor capable of controlling a threshold voltage may be used. As such a transistor, use is made of a field effect transistor of a so-called stack gate structure having a floating gate 16 and a control gate 18 (shown in FIG. 3). The write control circuit is one which comprises, for example, the column control circuit 2, row control circuit 3, source line control circuit 4, p-type well control circuit 5, data input/output buffer 6, command interface 7, and state device 8, as is explained in one of the embodiments above. However, these circuits 3 to 8 are not requisite in the write control circuit. Any circuit or a device may be used as long as it can perform the write control method shown in FIG. 7 or the write algorithm shown in FIG. 8.

The write control circuit supplies a first pre-programming pulse simultaneously to the first and second memory cells independently of the write statuses thereof. After the first pre-programming pulse is supplied, a second pre-programming pulse, whose potential is higher than the first pre-programming pulse by a first potential difference, is supplied to the first and second memory cells independently of the write statuses of these memory cells. As the first and second pre-programming pulses, either the 1st to 5th pulses of the pre-write voltage Vpgm (shown in FIG. 7), or the pulses having no interval (0 sec.) between the pre-programming pulses (shown in FIG. 8). The first potential difference is, but not limited to, 0.4 V.

Furthermore, the write control circuit supplies a second pre-programming pulse and thereafter, a staircase programming pulses is supplied simultaneously to the first and second memory cells. The staircase programming pulses has an initial voltage lower than the second pre-programming pulse and increases its voltage nearly at a rate of a second potential difference per pulse. The write operation to the memory cell that has been detected to reach a predetermined write status is inhibited during the supply of staircase programming pulses. As the initial voltage lower than the second pre-programming pulse, a voltage lower by 0.8 V than the second pre-programming pulse (as explained with reference to FIG. 7) may be used. The initial voltage is not limited to this. The second potential difference is, but not limited to, for example 0.2 V. Any potential difference is used as the second potential difference as long as it is lower than the first potential difference. As the staircase programming pulses, pulses after 6th one of the pre write voltage Vpgm (shown in FIG. 7) may be used.

According to the nonvolatile semiconductor memory device according to an embodiment of the present invention, the step-up voltage of the pre-programming pulse (that is, the first potential difference) during the pre-write operation period is larger than that of staircase programming pulses (that is, the second potential difference) during the write operation period. Therefore, compared to a data write method in which a programming pulse voltage is stepped up uniformly from the pre-write period to the write period, the threshold voltage of a memory cell(s) can be greatly shifted during the pre-write period. If the threshold voltage of a memory cell is greatly shifted (increased) during the pre-write period, the time required for the pre-write can be reduced. As a result, the total time required for data write (the pre-write period plus the write period) can be reduced.

According to the nonvolatile semiconductor memory device according to one of the embodiments mentioned above, the first potential difference is twice as large as the second potential difference. This means that the threshold voltage of a memory cell during the pre-write period can be shifted more than twice as large as that of the write period. This means that the pre-write period can be reduced to the half compared to the method where the programming pulse voltage is stepped up uniformly from the pre-write operation period to the write operation period.

Also, in the nonvolatile semiconductor memory device according to the embodiment mentioned above, the initial of the staircase programming pulses is lower than the second pre-programming pulse voltage by 4 times the amount of the second potential difference.

According to this, the pre-write voltage increases than that of the data write method shown in FIG. 6. Form this, on the assumption that the threshold voltages after supply of a pre-programming pulse are equal in two methods, the number of pre-programming pulses can be reduced compared to the data write method shown in FIG. 6. If the number of the pre-programming pulses can be decreased, the time required for the pre-write operation can be reduced.

In the nonvolatile semiconductor memory device according to the embodiment mentioned above, the first and second memory cells are connected to a common word line. Furthermore, the first and second memory cells are connected to discrete two bit lines, respectively. The write control circuit inhibits the write operation by supplying a staircase programming pulses to a word line, thereby increasing the voltage supplied to the bit line corresponding to the memory cell that has been determined to reach a predetermined write status. According to this, since the write operation to the memory cell that reached to the predetermined write status is inhibited during the write operation, the threshold voltage of the memory cell is not shifted unnecessarily. This effect is advantageous to a nonvolatile semiconductor memory device in which an upper and a lower limit is provided to the threshold voltage of the memory cell corresponding to a write status. As such a nonvolatile semiconductor memory device, there are a NAND type flash memory, in which unselected memory cells are made electrically conductive during a readout operation, and a so-called multi-level (valued) storage nonvolatile semiconductor memory device having several predetermined write statuses.

Now, the nonvolatile semiconductor memory device according to one of the embodiments of the present invention and several application examples using the nonvolatile semiconductor memory device according to a modified example of the present invention will be explained.

Figure 11:
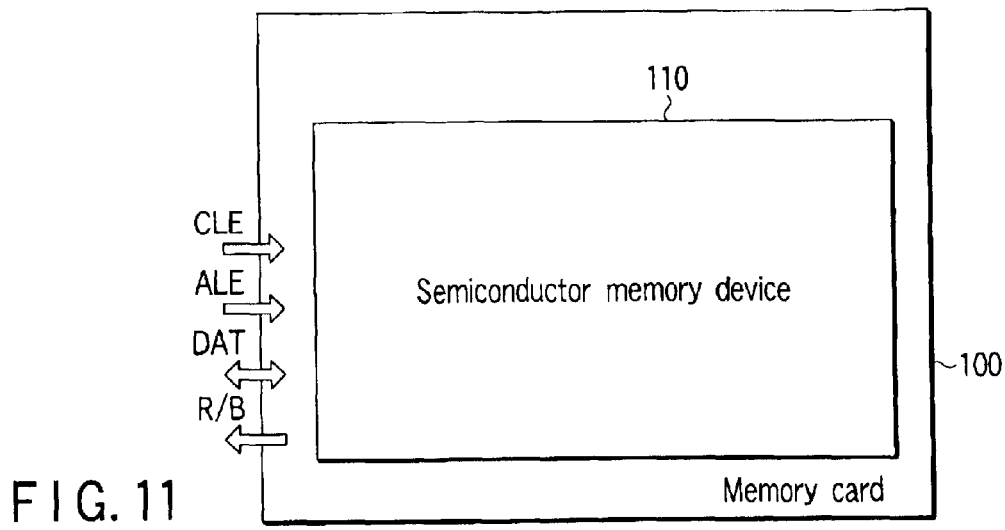
FIG. 11 is a block diagram showing an example of a memory card.

FIG. 11 shows an example of a memory card.

As shown in FIG. 11, a memory card 100 has a nonvolatile semiconductor memory device 110 according to an embodiment of the present invention or a modified example of the present invention. The semiconductor memory device 110 receives predetermined control signals and data from an external device (not shown) and outputs predetermined signals and data to the external device (not shown). To the semiconductor memory device 110 mounted on the memory card 100, the following are connected: a signal line (DAT) for transmitting data, addresses or commands; a command line enable signal (CLE) specifying that a command is being transmitted via the signal line DAT; an address line enable signal (ALE) specifying that an address is being transmitted via the signal line DAT; and a ready-busy signal line (R/B) specifying whether the semiconductor memory device 110 is operatable or not.

Figure 12:
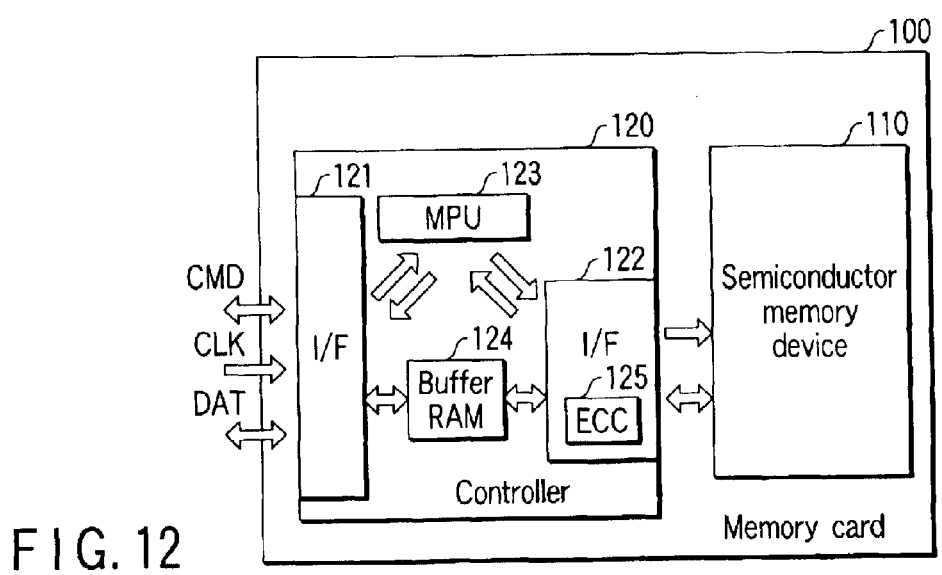
FIG. 12 is a block diagram showing another example of a memory card.

FIG. 12 shows another memory card as an example.

The memory card shown in FIG. 12 differs from the memory card 100 shown in FIG. 11 in that it has a controller 120 which controls a semiconductor memory device 110 to exchange predetermined signals to an external device (not shown).

The controller 120 comprises interface units (I/F) 121 and 122, which receive predetermined signals from each of the semiconductor memory device 110 and the external device (not shown) or output predetermined signals to the external device; a microprocessor unit (MPU) 123 which performs a predetermined calculation for converting a logic address input from the external device to a physical address; a buffer RAM 124 which stores data temporarily; an error correction center 125 which provides error correction codes. To the memory card 100, a command signal line (CMD), a clock signal line (CLK) and a data signal line (DAT) are connected.

In the memory cards 100 according to these application examples, the number of control signals, bit width of each of the signal lines and the structure of the controller 120 may be modified in various ways.

Figure 13:
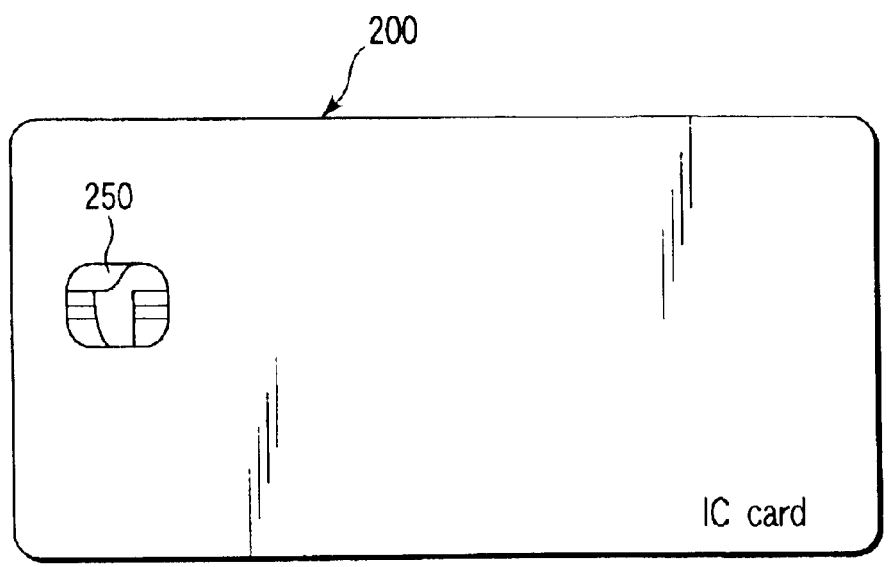
FIG. 13 is a plan view showing an example of an IC card.
Figure 14:
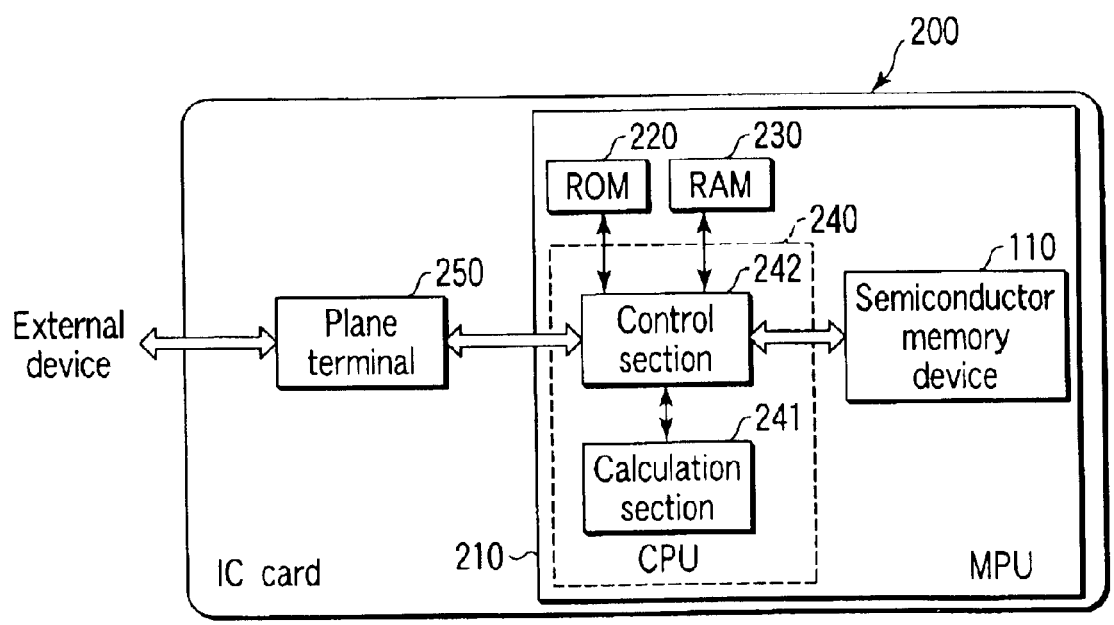
FIG. 14 is a block diagram showing the example of the IC card.

FIGS. 13 and 14 show examples of IC cards.

As shown in FIGS. 13 and 14, an IC card comprises a microprocessing unit(MPU) 210. The MPU 210 comprises, for example, a nonvolatile semiconductor memory device 110 according to an embodiment or a modified example of the present invention and other circuits such as a ROM 220, a RAM 230, and a CPU 240. The IC card 200 has a plane terminal 250 connectable to an electronic device. The plane terminal 250 is connected to the MPU 210. The CPU 240 includes an arithmetic unit 241 and a control unit 242, which is connected to the semiconductor memory device 110, the ROM 220, the RAM 230, and the arithmetic unit 241.

As described above, a nonvolatile semiconductor memory device according to an embodiment or a modified example of the present invention can be supplied to a memory card and an IC card.

Figure 15:
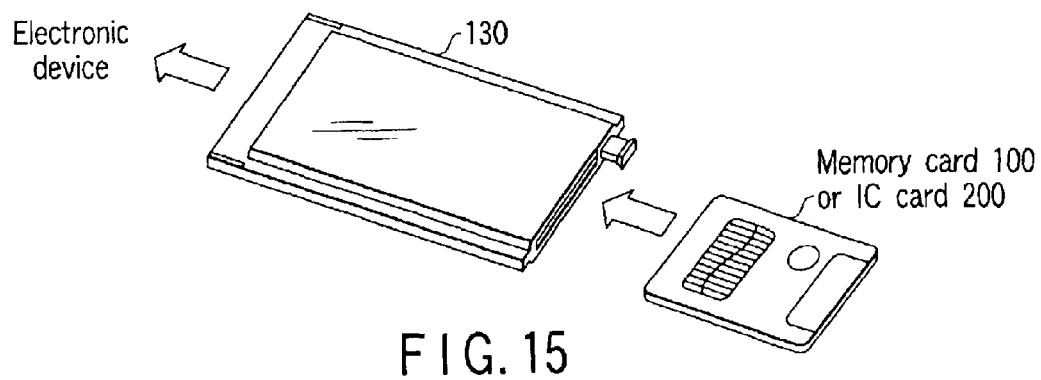
FIG. 15 is a perspective view showing an example of a card holder.

FIG. 15 shows an example of a card holder.

As shown in FIG. 15, the memory card 100 or the IC card 200 is inserted into the card holder 130 and further connected to an electronic device (not shown). The card holder 130 may have part of the functions of the controller 120 and the CPU 240.

Figure 16:
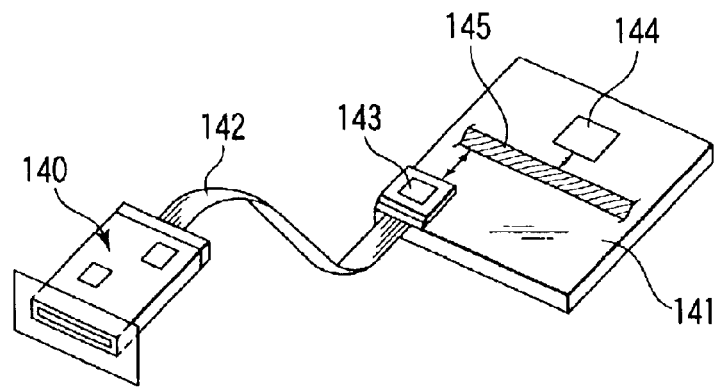
FIG. 16 is a perspective view showing an example of an electronic device.

FIG. 16 shows an example of the electronic device using the memory card 100, IC card 200, or card holder 130.

As shown in FIG. 16, the memory card 100, IC card 200, or card holder 130 is inserted to a connection device 140. The connection device 140 is connected to a board 141 by way of a connection line 142 and an interface circuit 143. On the board 141, a CPU 144 and a bus 145 are mounted. Such a board 141 may be used as circuit substrates for computers, printers, and cellular phones.

Figure 17:
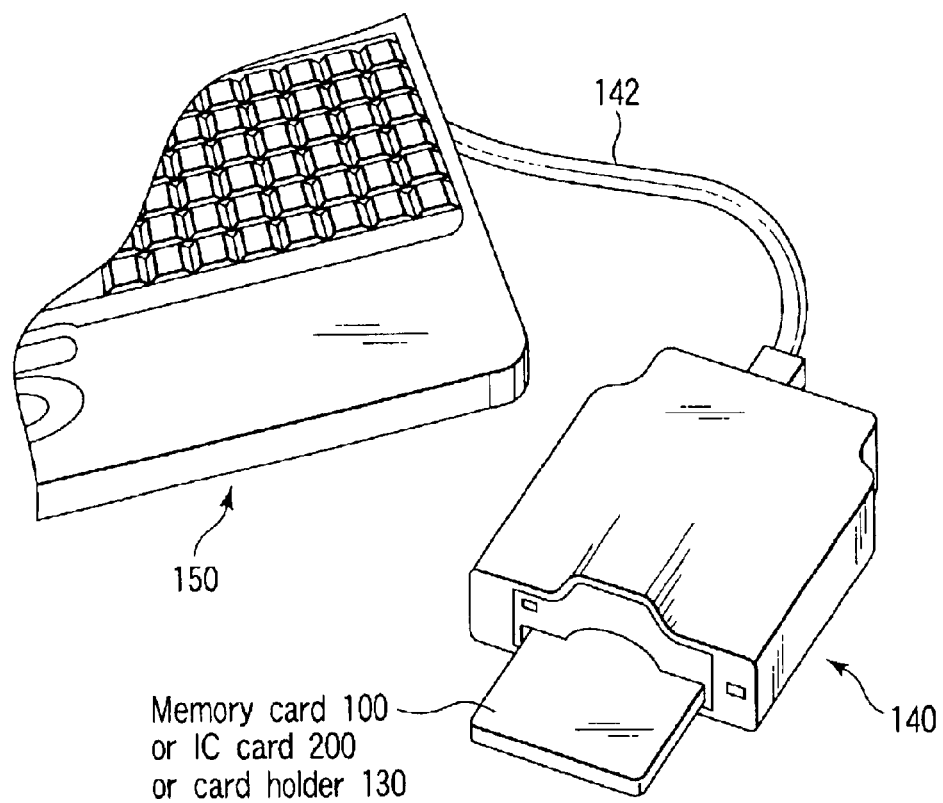
FIG. 17 is a perspective view showing another example of an electronic device.

FIG. 17 shows another example of the electronic device using the memory card 100 or card holder 130.

As shown in FIG. 17, the memory card 100 or the card holder 130 having the memory card 100 inserted therein is inserted to the connection device 140, which is further connected to an electronic device, e.g., a personal computer (PC) 150 by way of a connection line 142.

The memory card and IC card using a nonvolatile semiconductor memory device according to an embodiment or a modified example of the present invention may be used in various electronic devices.

Figure 18:
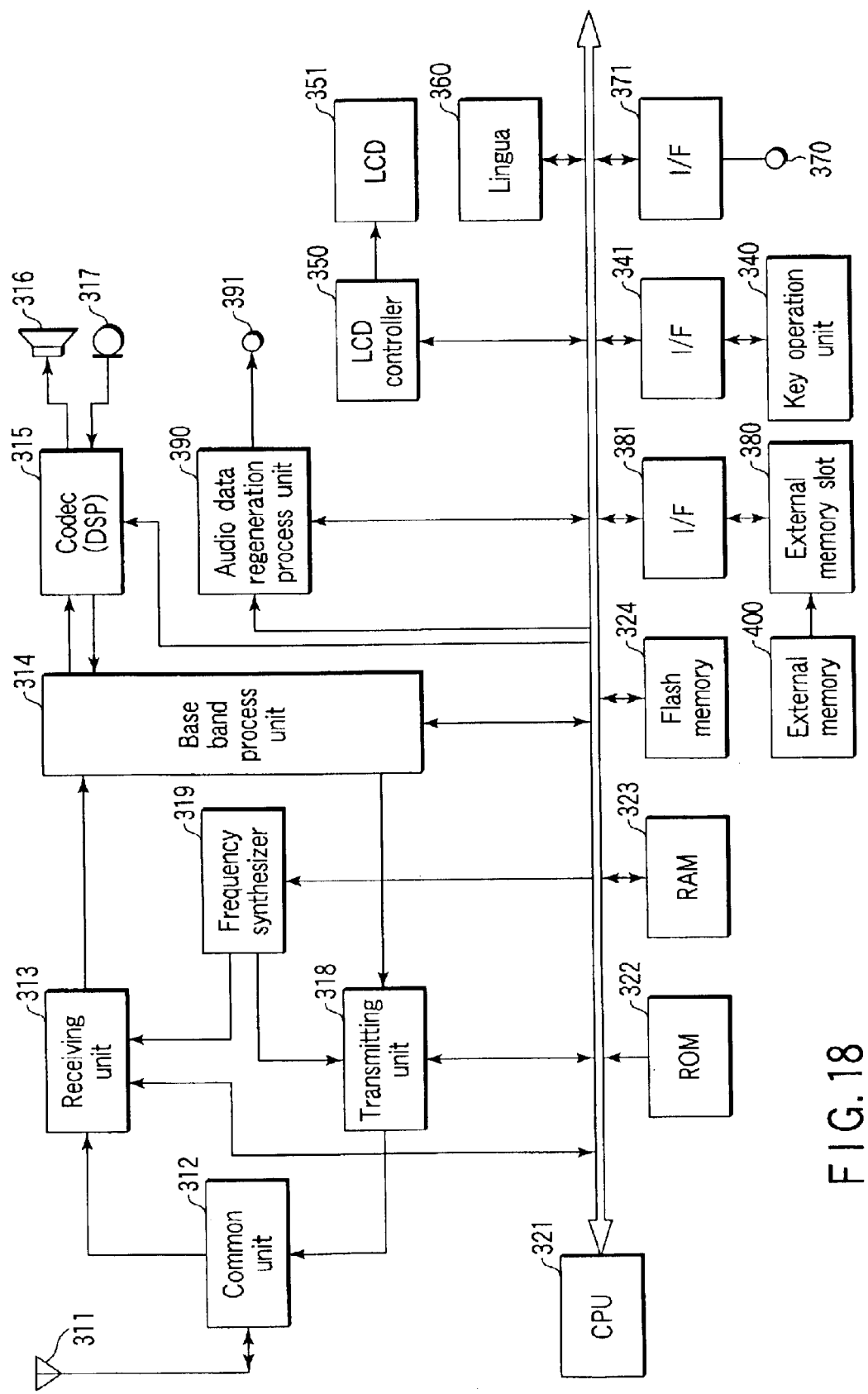
FIG. 18 is a block diagram showing an example of a cellular phone terminal.

FIG. 18 shows an example of a cellular phone terminal.

As shown in FIG. 18, a cellular phone terminal 300 comprises a communication section 310 and a control section 320.

The communication unit 310 comprises a transmit-receive antenna 311, a duplexer 312, a receiving unit 313, a base band process unit 314, distal signal processor (DSP) 315 serving as a voice codec, a speaker 316, a microphone 317, a transmit-receive unit 318, and a frequency synthesizer 319.

The control unit 320 comprises a CPU 321, a ROM 322, a RAM 323, and a nonvolatile semiconductor memory device (flash memory) 324 according to an embodiment or a modified example of the present invention. All of them are connected to the CPU 321 through a CPU bus 330. The ROM 322 stores programs to be executed in the CPU 321 and requisite data including a display font. The RAM 323 serves mostly as a working region, for example, for storing calculation data as needed during the operation of the CPU 321, and for temporarily storing data exchanged between the control section 320 and other sections. Since the flash memory 324 is a nonvolatile semiconductor memory device, the data stored in the flash memory will not disappear even if the power of the cellular phone terminal 300 is turned off. More specifically, the flash memory 324 stores setup parameters previously set before the power of the cellular phone terminal 300 is turned off until it is turned on again such that the cellular phone can be used in the same setup conditions.

The cellular phone terminal 300 according to this application embodiment further comprises a key operation unit 340, LCD controller 350, lingua 360, an external input/output terminal 370, an external memory slot 380, and audio regeneration process unit 390.

The key operation unit 340 is connected to the CPU bus 330 through an interface circuit (I/F) 341. The input data input through the key operation unit 340 is transmitted to the CPU 321, for example.

The LCD controller 350 receives display data from, the CPU 321 through the CPU bus 330 and converts it into LCD control data for controlling the LCD (liquid crystal display) 351 and then transmits the converted data to the LCD 351.

The lingua 360 generates a ringing tone and the like.

The external input/output connecter 370 is connected to the CPU bus 330 through an interface circuit (I/F) and serves as a connector for inputting data to and outputting it from the cellular phone terminal 300.

To an external memory slot 380, an external memory 400 such as a memory card is inserted. The external memory slot 380 is connected to the CPU bus 330 through the interface circuit (I/F) 381. By the presence of the slot 380 provided in the cellular phone terminal 300, data of the cellular phone terminal 300 can be transferred to the external memory 400 or data stored in the external memory 400 can be readout and input in the cellular phone terminal 300. As the external memory 400, the memory card 100, cardholder 130, and IC card 200 as mentioned above may be used.

The audio regeneration process unit 390 reproduces audio data input in the cellular phone terminal 300 and those stored in the external memory 400. The audio data thus reproduced can be output by means of a headphone and a walkabout speaker. By providing the audio regeneration process unit 390 in the cellular phone terminal 300, audio data can be reproduced.

As described in the foregoing, a nonvolatile semiconductor memory device according to an embodiment or a modified example of the present invention can be supplied to an electronic device such as a cellular phone.

In the foregoing, the embodiments and modified examples of the present invention have been explained. However, the present invention is not limited to these and may be modified in practice in various ways within the gist of the present invention. The embodiment of the present invention is not limited to the embodiments mentioned above.

The embodiments and modified examples of the present invention include various stages of invention, which can be extracted by combining a plurality of constitutional elements disclosed in each embodiment.

In each embodiment, the present invention has been explained based on an example in which the present invention is supplied to a nonvolatile semiconductor memory device. The present invention includes semiconductor integrated circuit devices such as processors and system LSIs having the nonvolatile semiconductor device as mentioned above therein.

As explained in the foregoing, according to the embodiments and modified examples, it is possible to provide a nonvolatile semiconductor memory device and a data write method capable of reducing the overall write operation time including a pre-write operation and a write operation by reducing the time of pre-write operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   first and second electrically rewritable nonvolatile semiconductor memory cells; and
   a write control circuit, which supplies a plurality of programming pulses simultaneously to the first and second memory cells, the write control circuit supplies:
      a first pre-programming pulse simultaneously to the first and second memory cells independently of the write statuses thereof;
      a second pre-programming pulse, after the supply of the first pre-programming pulse, simultaneously to the first and second memory cells independently of the write statuses thereof, the second pre-programming pulse having a potential higher than the first pre-programming pulse by a first potential difference; and
      staircase programming pulses, after the supply of the second pre-programming pulse, simultaneously to the first and second memory cells, the staircase programming pulses having an initial voltage lower than the second pre-programming pulse and increasing the voltage at a rate of a second potential difference per pulse, the second potential difference being smaller than the first potential difference.

2. The device according to claim 1, wherein the first potential difference is twice as large as the second potential difference.

3. The device according to claim 1, wherein the initial voltage of the staircase programming pulses is lower than the voltage of second pre-programming pulse by 4 times the amount of the second potential difference.

4. The device according to claim 1, wherein write to a memory cell that is selected from the first and second memory cells and that has been detected to reach a predetermined write status is inhibited during the supply of the staircase programming pulses.

5. The device according to claim 4, wherein the first memory cell is connected to a word line and a first bit line and the second memory cell is connected to the word line and a second bit line, the write control circuit supplies the programming pulses to the word line and increases the voltage supplied to at least one of the first and second bit lines corresponding to the memory cell have been detected to reach a predetermined write status.

6. The device according to claim 5, wherein an upper or lower limit is set to threshold voltages of the first and second memory cells have been reach a predetermined write status.

7. The device according to claim 6, wherein the first and second memory cells are made electrically conductive when the first and second memory cells are unselected during the readout operation.

8. The device according to claim 7, wherein the first and second memory cells constitute a NAND type nonvolatile semiconductor memory device.

9. The device according to claim 5, wherein the predetermined write status may be any one of a plurality.

10. The device according to claim 9, wherein the first and second memory cells constitute a multi-level storage nonvolatile semiconductor memory device.

11. A semiconductor integrated circuit device comprising:
    first and second electrically rewritable nonvolatile semiconductor memory cells; and
    a write control circuit, which supplies a plurality of programming pulses simultaneously to the first and second memory cells, the write control circuit supplies:
       a pre-programming pulse simultaneously to the first and second memory cells independently of the write statuses thereof; and
       staircase programming pulses, after the supply of the pre-programming pulse, simultaneously to the first and second memory cells, the staircase programming pulses having an initial voltage lower than the pre-programming pulse and increasing the voltage at a rate of a potential difference per pulse, wherein write to a memory cell that is selected from the first and second memory cells and that has been detected to reach a predetermined write status is inhibited during the supply of the staircase programming pulses.

12. The device according to claim 11, wherein the initial voltage of the staircase programming pulses is lower than the voltage of the pre-programming pulse by 4 times the amount of the predetermined potential difference.

13. The device according to claim 11, wherein the first memory cell is connected to a word line and a first bit line and the second memory cell is connected to the word line and a second bit line, the write control circuit supplies the programming pulses to the word line and increases the voltage supplied to at least one of the first and second bit lines corresponding to the memory cell have been detected to reach a predetermined write status.

14. The device according to claim 13, wherein an upper or lower limit is set to threshold voltages of the first and second memory cells have been reach a predetermined write status.

15. The device according to claim 14, wherein the first and second memory cells are electrically made conductive when the first and second memory cells are unselected during the readout operation.

16. The device according to claim 15, wherein the first and second memory cells constitute a NAND type nonvolatile semiconductor memory device.

17. The device according to claim 13, wherein the predetermined write status may be any one of a plurality.

18. The device according to claim 17, wherein the first and second memory cells constitute a multi-level storage nonvolatile semiconductor memory device.

19. A method of controlling a write operation of a nonvolatile semiconductor memory device comprising:

supplying a first pre-programming pulse simultaneously to first and second memory cells that are connected to a common word line and discrete two bit lines independently of the write statuses of the first and second memory cells;

supplying a second programming pulse, after the supply of the first pre-programming pulse, simultaneously to the first and second memory cells independently of the write statuses thereof, the second programming pulse being higher than the first pre programming pulse by a first potential difference;

supplying a staircase programming pulses, after the supply of the second pre-programming pulse, simultaneously to the first and second memory cells, the staircase programming pulses having an initial voltage lower than the second pre-programming pulse and increasing the voltage nearly at a rate of a second potential difference per pulse, and the second potential difference being smaller than the first potential difference; and inhibiting a write operation to a memory cell that has been detected to reach a predetermined write status during supply of the staircase programming pulses.

20. A method of controlling a write operation of a nonvolatile semiconductor memory device comprising:

supplying a pre-programming pulse simultaneously to first and second memory cells connected to a common word line and discrete two bit lines, respectively, independently of the write statuses of the first and second memory cells; and supplying staircase programming pulses, after the supply of the pre-programming pulse, simultaneously to the first and second memory cells, the staircase programming pulses having an initial voltage lower than the pre-programming pulse and increasing the voltage nearly at a rate of a predetermined potential difference per pulse; and inhibiting write to a memory cell that has been detected to reach a predetermined write status during supply of the staircase programming pulses.

* * * * *